(12) United States Patent
Cai

(10) Patent No.: US 7,963,791 B1
(45) Date of Patent: Jun. 21, 2011

(54) ZERO INSERTION FORCE ELECTRICAL CONNECTOR WITH A METAL REINFORCER WITH A HEAD WITH A DRIVING ELEMENT

(75) Inventor: You Hua Cai, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/958,966

(22) Filed: Dec. 2, 2010

(30) Foreign Application Priority Data

Jul. 13, 2010 (CN) ...................... 2010 2 0266184 U

(51) Int. Cl.
*H01R 13/629* (2006.01)
(52) U.S. Cl. ........................................................ 439/342
(58) Field of Classification Search .................. 439/342, 439/259, 260
See application file for complete search history.

(56) References Cited

U.S. PATENT DOCUMENTS

| | | | | |
|---|---|---|---|---|
| 6,250,941 B1 * | 6/2001 | Huang et al. | ................... | 439/342 |
| 6,254,415 B1 * | 7/2001 | Mizumura et al. | ............ | 439/342 |
| 6,296,506 B1 * | 10/2001 | Mizumura et al. | ............ | 439/342 |
| 6,296,507 B1 * | 10/2001 | Huang | ........................... | 439/342 |
| 6,338,640 B1 * | 1/2002 | Lin | ............................... | 439/342 |
| 6,464,525 B2 * | 10/2002 | Mizumura | ..................... | 439/342 |
| 6,500,019 B1 * | 12/2002 | Tan | ................................ | 439/342 |
| 7,771,219 B1 * | 8/2010 | Szu et al. | ...................... | 439/259 |
| 7,771,224 B2 * | 8/2010 | Cheng et al. | .................. | 439/342 |
| 2001/0018286 A1 * | 8/2001 | Mizumura | ..................... | 439/342 |

* cited by examiner

*Primary Examiner* — Chandrika Prasad
(74) *Attorney, Agent, or Firm* — Tim Tingkang Xia; Morris, Manning & Martin, LLP

(57) ABSTRACT

A ZIF electrical connector includes: an insulative base having connected non-accommodating and accommodating areas, and the accommodating area includes containing holes; conductive terminals, each being contained in the containing hole; an insulative upper casing covered onto the insulative base and having a carrying area corresponding to the accommodating area, and the carrying area having through grooves, and each through groove corresponding to a conductive terminal; a metal reinforcer fixed to the insulative upper casing, and having a head corresponding to the non-accommodating area and a reinforced side arm extended separately from both sides of the head, and the head and the two reinforced side arms being enclosed to define an idle space corresponding to the carrying area; a driving element, installed in the head and the non-accommodating area, for driving the metal reinforcer to slide the insulative upper casing with respect to the insulative base.

20 Claims, 6 Drawing Sheets

ZERO INSERTION FORCE ELECTRICAL CONNECTOR WITH A METAL REINFORCER WITH A HEAD WITH A DRIVING ELEMENT

CROSS-REFERENCE TO RELATED PATENT APPLICATION

This non-provisional application claims priority under 35 U.S.C. §119(a) on Chinese Patent Application No(s). 201020266184.3 filed in China on Jul. 13, 2010, the entire contents of which are hereby incorporated by reference.

Some references, if any, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references, if any, listed, cited and/or discussed in this specification are incorporated herein by reference in their entireties and to the same extent as if each reference was individually incorporated by reference.

FIELD OF THE INVENTION

The present invention relates to an electrical connector, and more particularly to a zero insertion force (ZIF) electrical connector for electrically connecting a chip module and a printed circuit board.

BACKGROUND OF THE INVENTION

A common PGA type electrical connector as disclosed in P.R.C. Pat. No. CN200920052905.8 generally includes an insulative body, a plurality of conductive terminals accommodated in the insulative body, an upper casing covered onto the insulative body, and a driving device for driving the upper casing to slide along the insulative body.

As the conductive terminals tend to become more compact, the aforementioned structure has the following drawbacks: When the driving device drives the upper casing to slide along the insulative body, pins of a chip module are entered from a ZIP position to a position in contact with the conductive terminal and clamped at the contact position by the conductive terminals. Since there are many conductive terminals, a very large driving force is required, so that the aforementioned upper casing made of a plastic material usually cannot stand the large driving force and may break or crack easily.

If the upper casing is produced by stamping a metal sheet and coating an insulative material onto the surface of the upper casing to achieve insulation effect, the aforementioned problem can be overcome, but other new problems will arise. Firstly, the overall manufacturing time of the electrical connector is increased, since two processes for stamping and insulating the metal upper casing are involved. Secondly, the upper casing requires through holes corresponding to the conductive terminals to pass the pins, therefore it is necessary to form small holes on the metal sheet, and it is difficult to control the precision, and thus increasing the cost significantly. Thirdly, the through holes may rub with the pins easily, and the insulative material around the periphery of the through holes may be worn and the insulation effect may be lost, such that the electrical connector cannot work properly.

Therefore, a heretofore unaddressed need exists in the art to address the aforementioned deficiencies and inadequacies.

SUMMARY OF THE INVENTION

In one aspect, the present invention provides a ZIF electrical connector that can enhance the strength of an insulative upper casing to fit the compact design of the conductive terminals.

In one embodiment, the present invention adopts the following inventive measures and provides a ZIF electrical connector comprising: an insulative base, having a non-accommodating area and an accommodating area connected with each other, and the accommodating area including a plurality of containing holes; a plurality of conductive terminals, contained in the corresponding containing holes respectively; an insulative upper casing, covered onto the insulative base, and having a carrying area corresponding to the accommodating area, and the carrying area having a plurality of through grooves, and each through groove corresponding to one of the conductive terminals; a metal reinforcer, fixed at the insulative upper casing, and having a head corresponding to the non-accommodating area and a reinforced side arm extended separately from both sides of the head, and the head and the two reinforced side arms being enclosed to define an idle space corresponding to the carrying area; and a driving element, installed in the head and the non-accommodating area, for driving the metal reinforcer to slide the insulative upper casing with respect to the insulative base.

Compared with the prior art, the ZIF electrical connector of the present invention includes the insulative upper casing fixed with the metal reinforcer, and the idle space corresponds to the carrying area of the insulative upper casing, and the pins of a chip module are passed through the through grooves and entered into the containing holes to provide a very good insulation between the conductive terminals. When the metal reinforcer drives the insulative upper casing to slide with respect to the insulative base, the two reinforced side arms can enhance the strength of the insulative upper casing to avoid the insulative upper casing from breaking or cracking easily due to its insufficient strength.

These and other aspects of the present invention will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The drawings described below are for illustration purposes only. The drawings are not intended to limit the scope of the present teachings in any way.

DETAILED DESCRIPTION OF THE PREFERRED EMBODIMENTS

Figure 1:
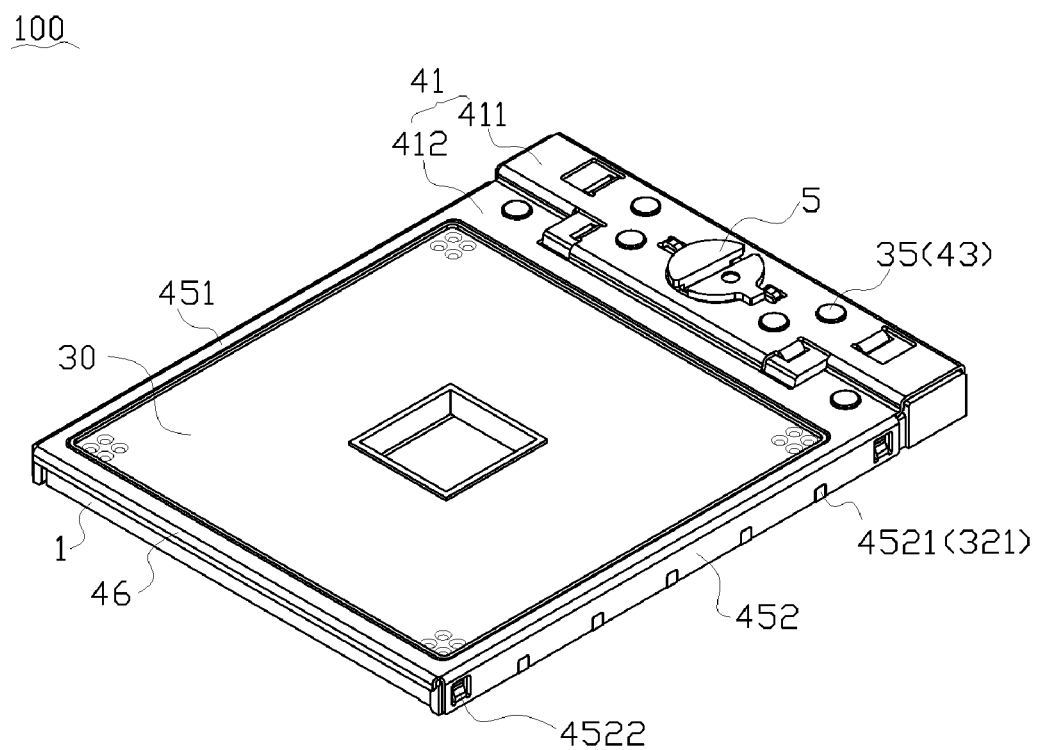
FIG. 1 is a perspective view of a ZIF electrical connector in accordance with a first preferred embodiment of the present invention.

The present invention is more particularly described in the following examples that are intended as illustrative only since numerous modifications and variations therein will be apparent to those skilled in the art. Various embodiments of the invention are now described in detail. Referring to the drawings, FIGS. 1-6, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" means two or more.

As used herein, the terms "comprising," "including," "carrying," "having," "containing," "involving," and the like are to be understood to be open-ended, i.e., to mean including but not limited to.

The ZIF electrical connector of the present invention is described by the following preferred embodiments and illustrated by related drawings as follows.

Figure 2:
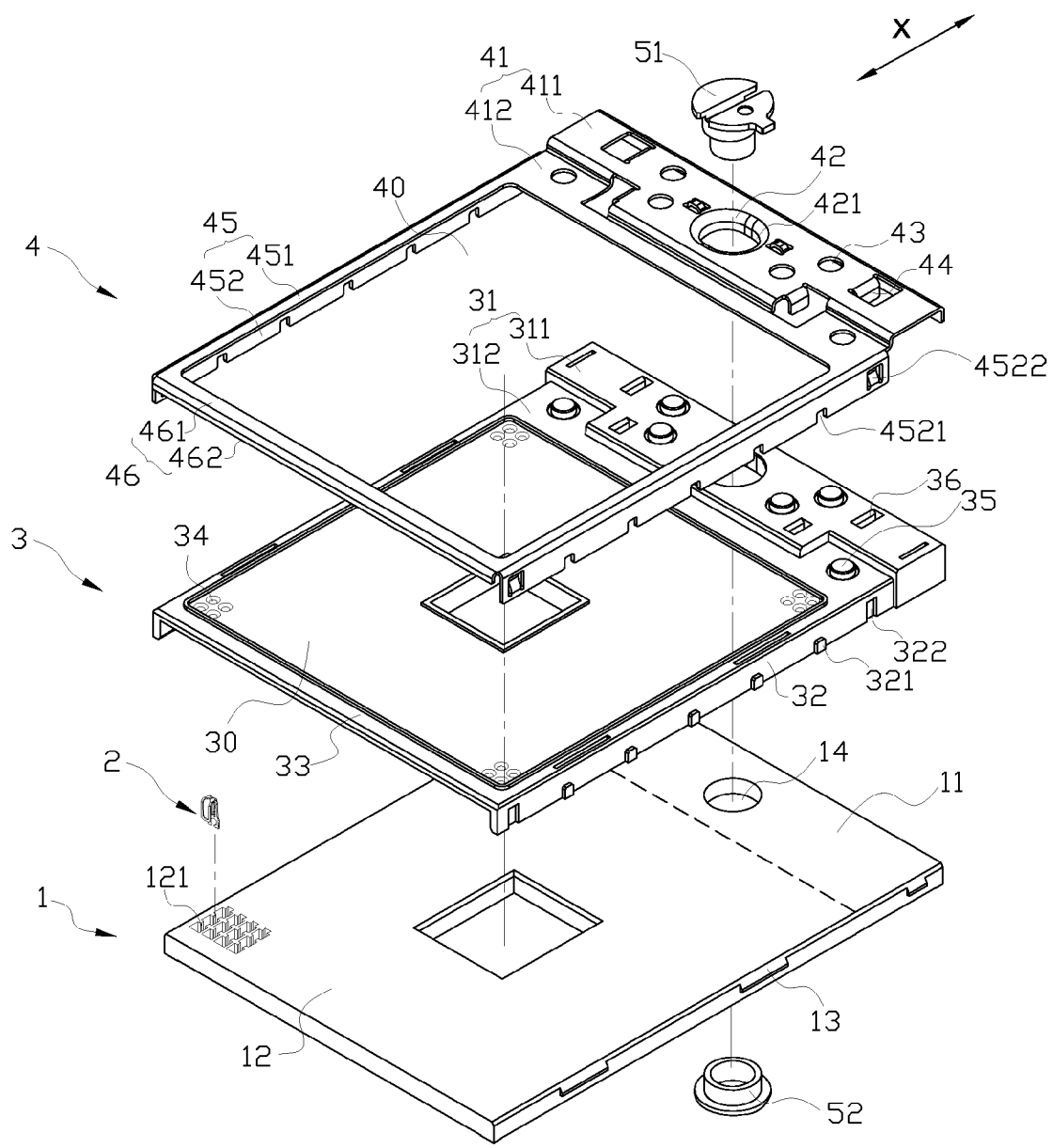
FIG. 2 is an exploded view of a ZIF electrical connector as depicted in FIG. 1.
Figure 3:
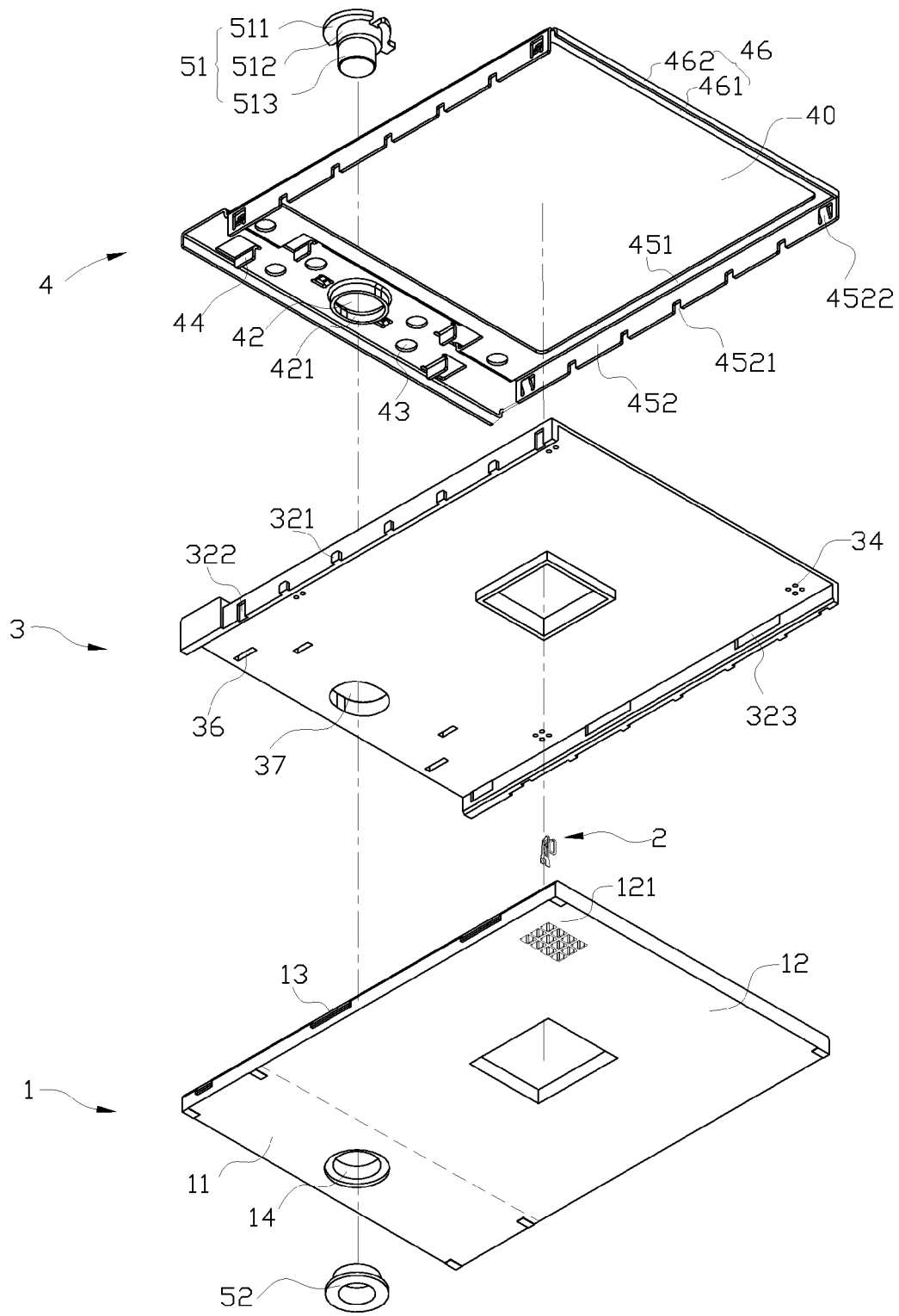
FIG. 3 is an exploded view of a ZIF electrical connector as depicted in FIG. 1 and viewed from another angle.

With reference now to FIGS. 1 to 3 for a ZIF electrical connector 100 in accordance with a first preferred embodiment of the present invention, the ZIF electrical connector 100 has an insulative base 1, a plurality of conductive terminals 2 contained in the insulative base 1, an insulative upper casing 3 covered onto the insulative base 1, and a metal reinforcer 4 installed at the insulative upper casing 3.

The insulative base 1 is substantially a cuboid and includes a non-accommodating area 11 and an accommodating area 12. The accommodating area 12 includes a plurality of containing holes 121 arranged into a matrix. The non-accommodating area 11 does not include any containing hole 121, but it includes a circular hole 14. The insulative base 1 includes a positioning bump 13 protruded separately from both sides of the insulative base 1, and a plurality of conductive terminals 2, wherein each conductive terminal 2 is contained in one of the containing holes 121 for transmitting electric signals between a chip module and a printed circuit board.

The insulative upper casing 3 has a main body substantially in the shape of a rectangular slab and includes a carrying area 30 corresponding to the accommodating area 12 and a non-carrying area 31 corresponding to the non-accommodating area 11. The carrying area 30 includes a plurality of through grooves 34 arranged substantially in a matrix, and each through groove 34 corresponds to one of the containing holes 121 for passing each corresponding pin of the chip module. The non-carrying area 31 does not come with any through groove 34, but it has a protruding pillar 35, a positioning slot, and a first elliptical hole 37. Viewing from the top of the insulative upper casing 3, we can observe that the non-carrying area 31 includes a first convex area 311 and a first concave area 312, and the first convex area 311 has a height greater than the height of the first concave area 312, and the first elliptical hole 37 is formed in the first convex area 311. Two sidewalls 32 are extended downwardly and respectively from both sides of the insulative upper casing 3, and each sidewall 32 includes a protrusion 321, an inwardly concave area 322 and a fixing groove 323 corresponding to the positioning bump 13.

The metal reinforcer 4 is in a frame-shape, and includes a head 41 corresponding to the non-carrying area 31, and the head 41 includes a convex area 411 and a concave area 412, and the convex area 411 corresponds to the first convex area 311, and the concave area 412 corresponds to the first concave area 312. The head 41 includes a second elliptical hole 42, a plurality of fixing holes 43 and a first positioning elastic plate 44. The second elliptical hole 42 corresponds to the first elliptical hole 37, and a lengthened portion 421 is formed and extended downwardly from the second elliptical hole 42. The fixing hole 43 corresponds to the protruding pillar 35, and the first positioning elastic plate 44 corresponds to the positioning slot 36. A reinforced side arm 45 is extended separately from both sides of the concave area 412, and the two reinforced side arms 45 and the head 41 are enclosed to define an idle space 40, and the idle space 40 is provided for exposing the carrying area 30, and entering pins of the chip module into the through grooves 34 and the containing holes 121. A reinforced distal arm 46 is connected to a free end of each of the two reinforced side arms 45.

Each reinforced side arm 45 includes a transversal side arm 451 and a vertical side arm 452, and the vertical side arm 452 is formed by being bent and extended downwardly from the transversal side arm 451. The transversal side arm 451 corresponds to the lateral edge of a slab-shaped main body of the insulative upper casing 3, and the vertical side arm 451 corresponds to the sidewall 32 of the insulative upper casing 3. The vertical side arm 452 includes a plurality of grooves 4521 and a plurality of second positioning elastic plates 4522, and the grooves 4521 match with the protrusions 321, and the second positioning elastic plates 4522 are latched into the inwardly concave area 322. The reinforced distal arm 46 includes a transversal distal arm 461 and a vertical distal arm 462, and the vertical distal arm 462 is formed by bending and extending the transversal distal arm 461 downward, and the reinforced distal arm 46 is provided for reinforcing a distal edge 33 of the insulative upper casing 3.

The driving element 5 is made of metal and includes an eccentric cam 51 and a positioning sheath 52. The eccentric cam 51 includes a turning portion 511, a first pillar 512 and a second pillar 513 sequentially installed from top to bottom, wherein the first pillar 512 and the second pillar 513 are biased. The eccentric cam 51 is passed from top to bottom sequentially through the second elliptical hole 42, the first elliptical hole 37 and the circular hole 14. The lengthened portion 421 is entered into the first elliptical hole 37, and the positioning sheath 52 is installed at the circular hole 14, and the second pillar 513 is embedded into the positioning sheath 52. If the turning portion 511 is not rotated, the insulative upper casing 3 and the insulative base 1 will be at an open status. Now, the pins of the chip module can be entered into the containing hole 121 with zero insertion force. If the turning portion 511 is rotated by 180 degrees, the insulative upper casing 3 and the insulative base 1 will be at a closed status. Now, the pins of the chip module will be clamped at the contact positions of the conductive terminals 2. During the process of rotating the turning portion 511, the driving element 5 transmits a driving force to the metal reinforcer 4, and the metal reinforcer 4 drives the insulative upper casing 3 to slide with respect to the insulative base 1 in an X direction, and the insulative base 1 has been passed through the conductive terminal 2 already and soldered onto the printed circuit board.

Figure 4:
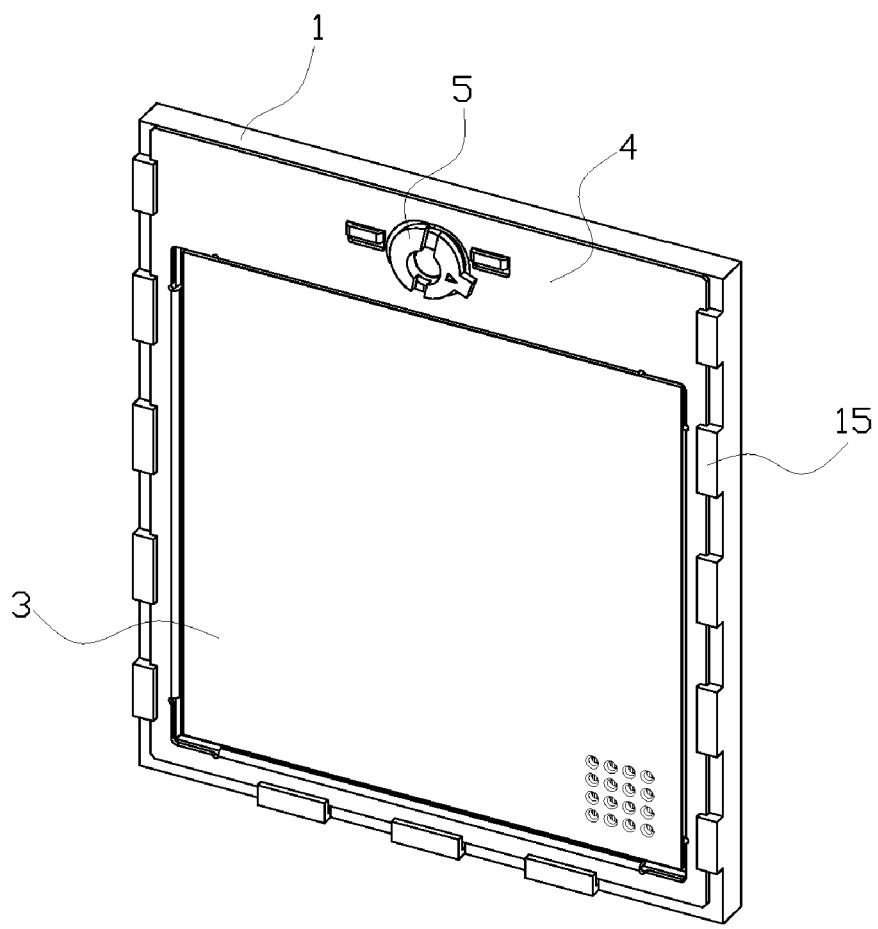
FIG. 4 is a perspective view of a ZIF electrical connector in accordance with a second preferred embodiment of the present invention.
Figure 5:
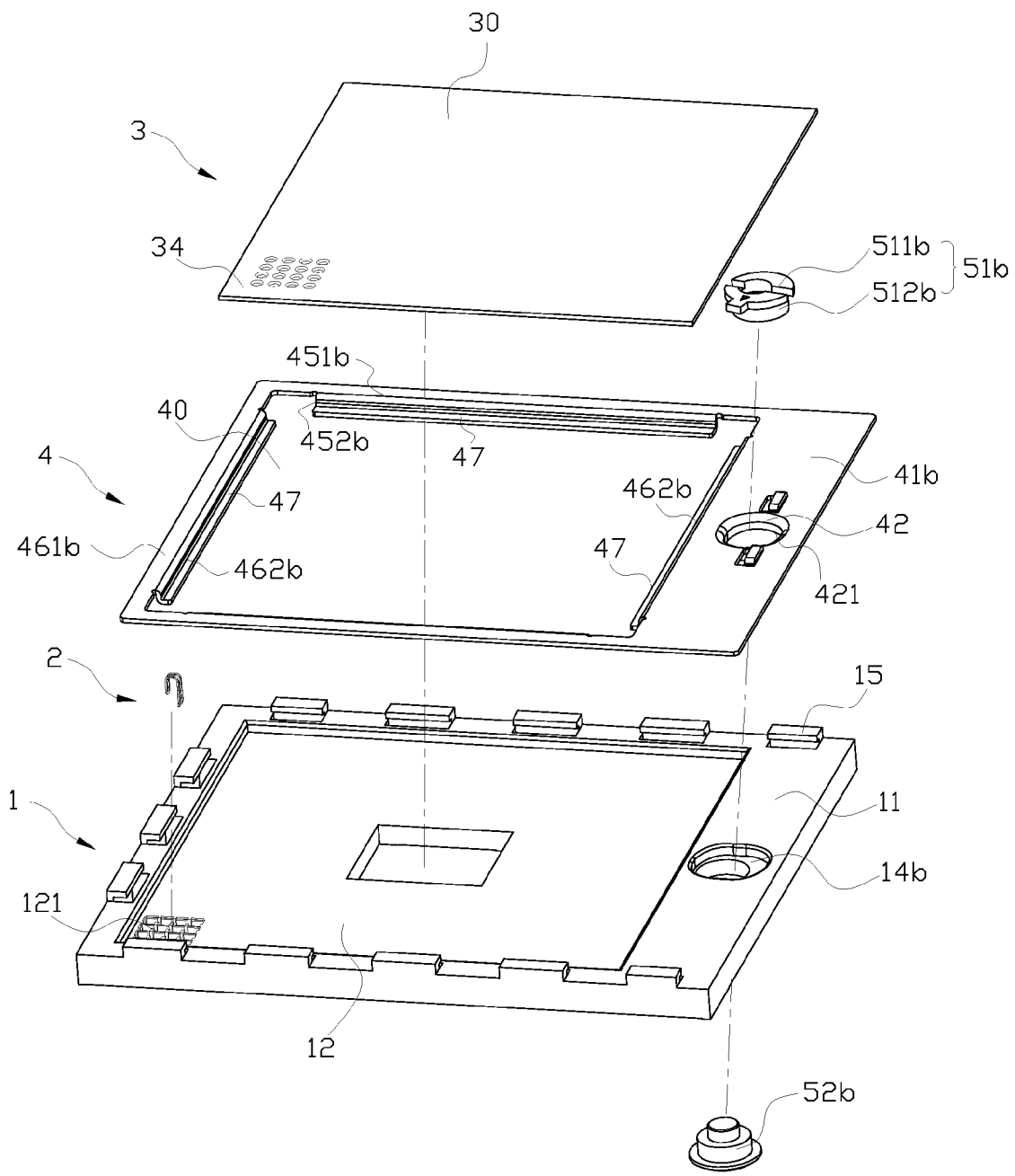
FIG. 5 is an exploded view of a ZIF electrical connector as depicted in FIG. 4.

With reference to FIGS. 4 and 5 for a ZIF electrical connector in accordance with a second preferred embodiment of the present invention, the difference between the ZIF electrical connector 100 of the second preferred embodiment and the first preferred embodiment resides on that the insulative upper casing 3 of the second preferred embodiment does not have any non-carrying area 31 or sidewall 32, but it is a slab having the through grooves 34. The head 41b of the metal reinforcer 4 simply includes the second elliptical hole 42, and the head 41b corresponds to the edge of the idle space 40 and is bent and extended to form the vertical distal arm 462b. The vertical side arm 452 around the idle space 40 is formed by bending the transversal side arm 451b inwardly towards the idle space 40, and the vertical distal arm 462b is also formed by bending the transversal side arm 461b inwardly towards the idle space 40. The vertical side arm 452b does not have any groove 4521 or second positioning elastic plates 4522. The vertical side arm 452b and the vertical distal arm 462b are further bent towards the idle space 40 to form leveled walls 47 for receiving the insulative upper casing 3. The insulative upper casing 3 fully occupies the idle space 40, and abuts the vertical side arm 452b and the vertical distal arm 462b to achieve the interference fit of the metal reinforcer 4.

The insulative base 1 includes an inverted L-shape fixing bump 15 extended upwardly from an edge of the insulative base 1, and the metal reinforcer 4 is embedded into the fixing bump 15. The eccentric cam 51b simply includes the turning portion 511b and the hollow first pillar 512b, and the first pillar is biased. The circular hole 14b of the insulative base 1 is a two-layer structure with an upper part in an elliptical shape and a lower part in a circular shape, and the eccentric cam 51b is passed through the second elliptical hole 42 and sheathed on the positioning sheath 52b of the circular hole 14b.

Figure 6:
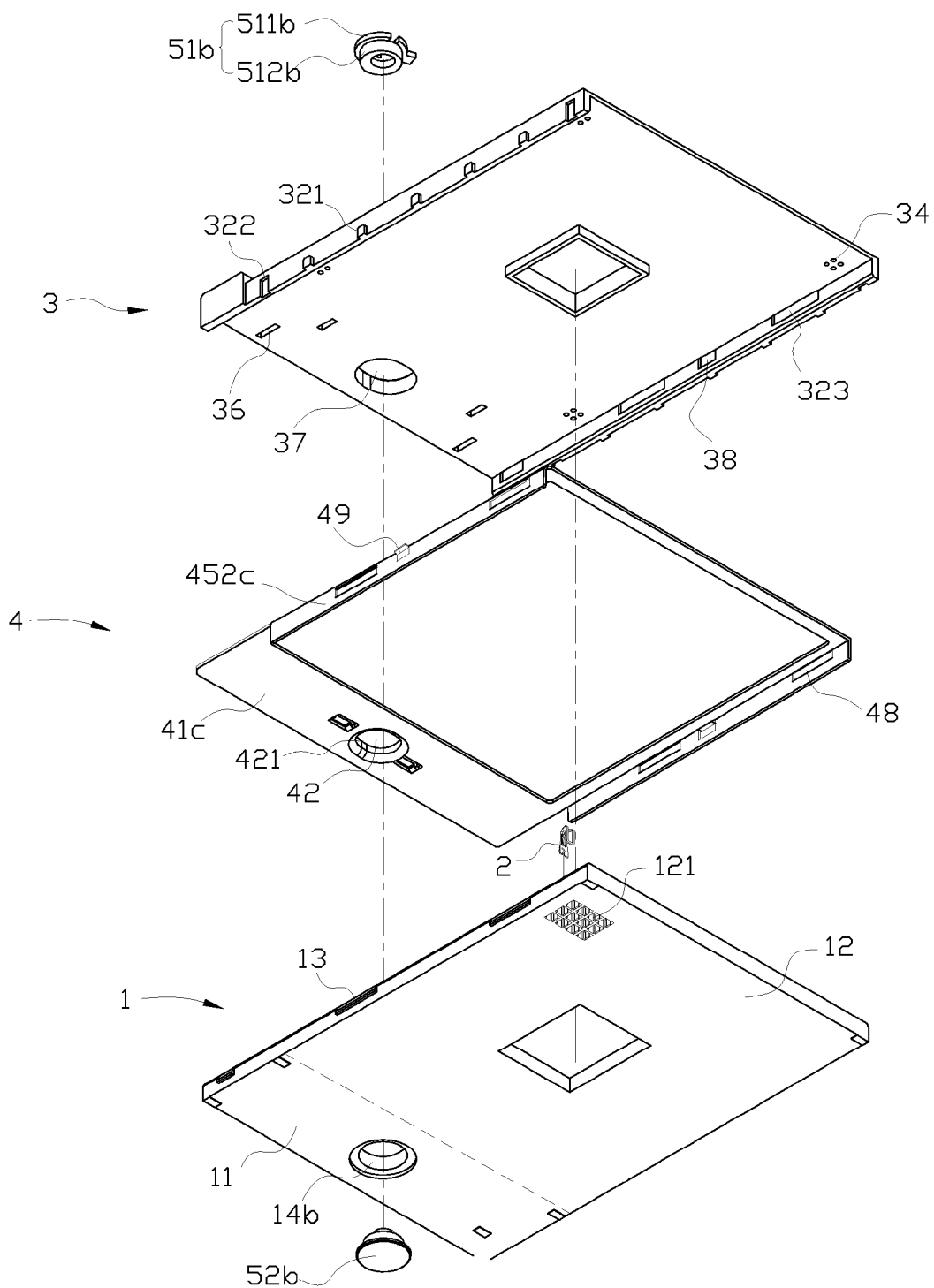
FIG. 6 is an exploded view of a ZIF electrical connector in accordance with a third preferred embodiment of the present invention.

With reference to FIG. 6 for an exploded view of a ZIF electrical connector in accordance with a third preferred embodiment of the present invention, the difference between the third preferred embodiment and the first preferred embodiment resides on that the metal reinforcer 4 of the third preferred embodiment is disposed between the insulative upper casing 3 and the insulative base 1. The head 41c is in the shape of a slab, and simply includes the second elliptical hole 42. The vertical side arm 452c includes a through hole 48 for passing the positioning bump 13 of the insulative base 1.

The vertical side arm 452c includes a latch bump 49 fixed by a latch 38 of the insulative upper casing 3. The eccentric cam 51b simply includes the turning portion 511b and the hollow first pillar 512b, and the first pillar 512b is biased. The circular hole 14b of the insulative base 1 is a two-layer structure with an upper part in an elliptical shape and a lower part in a circular shape, and the eccentric cam 51b is passed through the second elliptical hole 42 and sheathed on the positioning sheath 52b of the circular hole 14b.

In summation, the ZIF electrical connector 100 of the present invention has the following advantages:

(1) The invention provides the insulative upper casing 3, so that before the pins of the chip module enter into the containing hole 121, the pins pass through the through grooves 34 of the insulative upper casing 3 first, and the pins will not be electrically contacted with each other to interfere with electric signals.

(2) The reinforced side arm 45 may just refer to the vertical side arm 452, 452b, or refer to both of the transversal side arm 451, 451b and the vertical side arm 452, 452b, and the transversal side arm 451, 451b is provided for enhancing the strength of the insulative upper casing 3 in the longitudinal direction of the slab-shaped main body, and the vertical side arm 452, 452b is provided for enhancing the strength of the sidewall 32 of the insulative upper casing 3, while providing the transversal side arm 451, 451b and the vertical side arm 452, 452b to enhance the strength of the insulative upper casing in two different directions, so as to achieve the multi-direction reinforcement effect.

(3) The reinforced distal arm 46 may just refer to the vertical distal arm 462, 462b, or refer to both of the transversal distal arm 461, 461b and the vertical side arm 462, 462b, and either one can achieve the effect of enhancing the strength of the distal edge 33 of the insulative upper casing 3.

(4) The second elliptical hole 42 of the metal reinforcer 4 is extended downwardly to form the lengthened portion 421 and improve the contact between the driving element 5 and the metal reinforcer 4 in order to facilitate the metal reinforcer 4 to transmit the driving force to the insulative upper casing 3 and increase the strength of the insulative upper casing 3 for receiving forces produced while the insulative upper casing 3 slides with respect to the insulative base 1.

(5) In the first preferred embodiment, the convex area 411 is higher than the concave area 412 to facilitate the installation of the driving element 5, and the reinforced side arm 45 is extended separately from both sides of the concave area 412 to enhance the strength for connecting the reinforced side arm 45 and the head 41, which favors the metal reinforcer 4 to slide the insulative upper casing 3.

(6) In the first and third preferred embodiments, the side arms 32 of the insulative upper casing 3 may come with a double-layer structure, and a concave long groove is formed between the two layers, and the vertical side arm 451 is embedded into the concave long groove to further enhance the strength of the insulative upper casing 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A zero insertion force (ZIF) electrical connector, comprising:
   an insulative base, having a non-accommodating area and an accommodating area connected with each other, and the accommodating area including a plurality of containing holes;
   a plurality of conductive terminals, contained in the corresponding containing holes respectively;
   an insulative upper casing, covered onto the insulative base, and having a carrying area corresponding to the accommodating area, and the carrying area having a plurality of through grooves, and each through groove corresponding to one of the conductive terminals;
   a metal reinforcer, fixed at the insulative upper casing, and having a head corresponding to the non-accommodating area and a reinforced side arm extended separately from both sides of the head, and the head and the two reinforced side arms being enclosed to define an idle space corresponding to the carrying area; and
   a driving element, installed in the head and the non-accommodating area, for driving the metal reinforcer to slide the insulative upper casing with respect to the insulative base.

2. The ZIF electrical connector of claim 1, wherein the metal reinforcer is situated above the insulative upper casing.

3. The ZIF electrical connector of claim 1, wherein the metal reinforcer is situated between the insulative upper casing and the insulative base.

4. The ZIF electrical connector of claim 1, wherein the insulative upper casing includes a non-carrying area corresponding to the non-accommodating area.

5. The ZIF electrical connector of claim 1, wherein the insulative upper casing includes two symmetrical sidewalls.

6. The ZIF electrical connector of claim 5, wherein the reinforced side arm includes a groove and the sidewall includes a protrusion, and the protrusion is latched into the groove.

7. The ZIF electrical connector of claim 1, wherein the head includes a first elliptical hole, and a lengthened portion extended from the rim of the first elliptical hole.

8. The ZIF electrical connector of claim 7, wherein the insulative upper casing includes a second elliptical hole corresponding to the first elliptical hole for receiving the lengthened portion.

9. The ZIF electrical connector of claim 1, wherein the head includes a cascade concave area and a cascade convex area, and the concave area has a height smaller than the height of the convex area, and the reinforced side arms are extended from both sides of the concave area respectively.

10. The ZIF electrical connector of claim 1, wherein the reinforced side arm includes a vertical side arm.

11. The ZIF electrical connector of claim 10, wherein the reinforced side arm further includes a transversal side arm, and the vertical side arm is formed by bending and extending the transversal side arm downward.

12. The ZIF electrical connector of claim 1, wherein the metal reinforcer further includes a reinforced distal arm, and the two reinforced side arms are connected to both ends of the reinforced distal arm respectively, and the head, the two reinforced side arms and the reinforced distal arm are enclosed to define the idle space.

13. The ZIF electrical connector of claim 12, wherein the reinforced distal arm includes a vertical distal arm.

14. The ZIF electrical connector of claim 13, wherein the reinforced distal arm further includes a transversal distal arm, and the vertical distal arm is formed by bending and extending the transversal distal arm downward.

15. The ZIF electrical connector of claim 14, wherein the head includes the vertical distal arm extended from a side facing the idle space.

16. The ZIF electrical connector of claim 15, wherein each vertical distal arm includes a leveled wall bent and extended towards the idle space for receiving the insulative upper casing.

17. The ZIF electrical connector of claim 16, wherein the reinforced side arm includes a transversal side arm and a vertical side arm bent and extended downwardly from the transversal side arm, and the vertical side arm also includes the leveled wall bent and extended towards the idle space for receiving the insulative upper casing.

18. The ZIF electrical connector of claim 17, wherein the insulative upper casing and the metal reinforcer constitute an interference fit.

19. The ZIF electrical connector of claim 1, wherein the driving element includes an eccentric cam and a positioning sheath.

20. The ZIF electrical connector of claim 19, wherein the eccentric cam is installed at the head, and the positioning sheath is installed in the non-accommodating area.

* * * * *